(12) United States Patent  
Sakamoto et al.

(10) Patent No.: US 7,564,176 B2  
(45) Date of Patent: Jul. 21, 2009

(54) LAMINATED PIEZOELECTRIC ELEMENT AND PRODUCTION METHOD OF THE SAME

(75) Inventors: Hideya Sakamoto, Tokyo (JP); Keisuke Itakura, Tokyo (JP); Norimasa Sakamoto, Tokyo (JP)

(73) Assignee: TDK Corporation, Tokyo (JP)

( * ) Notice: Subject to any disclaimer, the term of this patent is extended or adjusted under 35 U.S.C. 154(b) by 131 days.

(21) Appl. No.: 11/684,275

(22) Filed: Mar. 9, 2007

(65) Prior Publication Data

US 2007/0222340 A1    Sep. 27, 2007

(30) Foreign Application Priority Data

Mar. 22, 2006    (JP)    ............... 2006-078130

(51) Int. Cl.  
 *H01L 41/187*    (2006.01)  
(52) U.S. Cl. ...................................... 310/358; 310/328  
(58) Field of Classification Search ................ 310/358; 501/134; 252/62.9 R, 62.9 PZ; 257/347  
See application file for complete search history.

(56) References Cited

U.S. PATENT DOCUMENTS

| 5,091,348 | A | * | 2/1992 | Woodhead et al. | ......... 501/136 |
| 5,164,882 | A | * | 11/1992 | Kanai et al. | ............. 361/321.5 |
| 5,279,996 | A | * | 1/1994 | Hase et al. | ................. 501/136 |
| 6,413,443 | B1 | * | 7/2002 | Furukawa et al. | ..... 252/62.9 PZ |
| 2001/0009345 | A1 | * | 7/2001 | Chang et al. | ............... 310/358 |
| 2003/0222240 | A1 | * | 12/2003 | Sasaki et al. | ............... 252/62 |
| 2004/0072670 | A1 | * | 4/2004 | Kasukawa et al. | ......... 501/134 |
| 2004/0087432 | A1 | * | 5/2004 | Sasaki | ....................... 501/134 |
| 2008/0018207 | A1 | * | 1/2008 | Nanataki et al. | ........... 310/358 |

FOREIGN PATENT DOCUMENTS

| EP | 156312 | A2 | * | 10/1985 |
| EP | 875493 | A1 | * | 11/1998 |
| JP | 10-316467 | A | | 12/1998 |
| JP | 2001111127 | A | * | 4/2001 |
| JP | 2003-238248 | A | | 8/2003 |
| JP | 2004-137106 | A | | 5/2004 |

\* cited by examiner

*Primary Examiner*—Jaydi SanMartin  
(74) *Attorney, Agent, or Firm*—Pearne & Gordon LLP

(57) ABSTRACT

A laminated piezoelectric element capable of being sintered at low temperatures and high in piezoelectric properties is provided. The laminated piezoelectric element comprises a plurality of piezoelectric layers each comprising a composite oxide as a main constituent thereof and a plurality of internal electrode layers formed between the piezoelectric layers and containing Ag, wherein the piezoelectric layers are each comprised of a sintered body comprising the composite oxide, as a main constituent thereof, represented by $(Pb_{a-b}M_b)[(Zn_{1/3}Nb_{2/3})_x Ti_y Zr_z]O_3$ with the proviso that $0.96 \leq a \leq 1.03$, $0 \leq b \leq 0.1$, $0.05 \leq x \leq 0.15$, $0.25 \leq y \leq 0.5$, $0.35 \leq z \leq 0.6$, $x+y+z=1$, and M represents at least one selected from Sr, Ca and Ba, and Ag in a content of 1.0% by weight or less (not inclusive of 0) in terms of $Ag_2O$ in relation to the main constituent.

11 Claims, 5 Drawing Sheets

LAMINATED PIEZOELECTRIC ELEMENT AND PRODUCTION METHOD OF THE SAME

BACKGROUND OF THE INVENTION

1. Field of the Invention

The present invention relates to a laminated piezoelectric element such as an actuator, a piezoelectric buzzer, a sound component and a sensor.

2. Description of the Related Art

Typical examples of the piezoelectric element may include an actuator. The actuator taking advantage of the displacement generated by the piezoelectric effect as the mechanical driving source has such advantages that the actuator is small in electric power consumption and in heat release, satisfactory in response, and capable of being reduced in size and weight; thus, the actuator has come to be applied to a wide variety of fields. Piezoelectric ceramic compositions to be used in such an actuator are required to be high in piezoelectric properties, in particular, large in piezoelectric strain constant. As piezoelectric ceramic compositions satisfying such properties, there have been developed, for example, a ternary piezoelectric ceramic composition containing lead titanate ($PbTiO_3$), lead zirconate ($PbZrO_3$) and lead zincate niobate [$Pb(Zn_{1/3}Nb_{2/3})O_3$], a piezoelectric ceramic composition in which the Pb in the above-mentioned ternary piezoelectric ceramic composition is partially substituted with Sr, Ba, Ca or the like, and other piezoelectric ceramic compositions.

However, these conventional piezoelectric ceramic compositions require sintering at relatively high temperatures of the order of 1100 to 1250° C., and undergo sintering in an oxidative atmosphere; consequently, for example, in laminated actuators or the like in which internal electrodes are simultaneously sintered, it is necessary to use as electrode materials noble metals (such as Pt and Pd) that are high in melting point and are not oxidized even when sintered in an oxidative atmosphere. As a result, the increase in cost is caused to offer an obstacle to price reduction of manufactured piezoelectric elements.

Under these circumstances, the present applicant has proposed in Patent Document 1 to enable low-temperature sintering by adding a first additive containing at least one selected from Fe, Co, Ni and Cu and a second additive containing at least one selected from Sb, Nb and Ta to the above-mentioned ternary piezoelectric ceramic compositions, and consequently to make usable low-price materials such as a Ag—Pd alloy for internal electrodes.

Patent Document 2 also discloses a proposal that the sintering at 900° C. or lower is made possible and the noble metal proportion in the internal electrodes is reduced by adding $Ag_2O$ in a proportion of 0.005 to 0.03% by weight to a perovskite composition represented by $Pb_a\{Zr_b \cdot Ti_c \cdot (Ni_{1/3}Nb_{2/3})_d \cdot (Zn_{1/3}Nb_{2/3})_e\}O_3$ wherein $1.000 \leq a \leq 1.020$, $0.26 \leq b \leq 0.31$, $0.34 \leq c \leq 0.40$, $0.10 \leq d \leq 0.35$, and $0.07 \leq e \leq 0.14$.

[Patent Document 1] Japanese Patent Laid-Open No. 2004-137106

[Patent Document 2] Japanese Patent Laid-Open No. 2003-238248

SUMMARY OF THE INVENTION

As described above, for the purpose of reducing the prices of the piezoelectric elements such as actuators, it is demanded to enable the low-temperature sintering of the piezoelectric ceramic compositions. In these years, in addition to the demand for the price reduction, demand for size reduction and sophistication of various products leads to demand for size reduction and sophistication for actuators to be used in such products. Size reduction of an actuator element while preserving the displacement magnitude thereof necessitates a piezoelectric element that has a further higher piezoelectric strain constant.

The present invention has been achieved on the basis of the above-mentioned technical problems, and takes as its object the provision of a laminated piezoelectric element capable of being sintered at low-temperatures and high in piezoelectric properties.

The present inventors have made various studies on the main constituent and the additives constituting the piezoelectric layers. Consequently, the present inventors have found that $Ag_2O$ as an additive is effective as a low-temperature sintering agent, and additionally improves the piezoelectric properties when added in a predetermined amount in relation to a particular main constituent composition. The present invention is based on this finding, and is accordingly a laminated piezoelectric element comprising: a plurality of piezoelectric layers each comprising a composite oxide as a main constituent thereof; and a plurality of internal electrode layers formed between the piezoelectric layers and containing Ag; wherein the piezoelectric layers are each comprised of a sintered body comprising: the composite oxide, as a main constituent thereof, represented by $(Pb_{a-b}M_b)[(Zn_{1/3}Nb_{2/3})_x Ti_y Zr_z]O_3$ with the proviso that $0.96 \leq a \leq 1.03$, $0 \leq b \leq 0.1$, $0.05 \leq x \leq 0.15$, $0.25 \leq y \leq 0.5$, $0.35 \leq z \leq 0.6$, $x+y+z=1$, and M represents at least one selected from Sr, Ca and Ba; and Ag in a content of 1.0% by weight or less (not inclusive of 0) in terms of $Ag_2O$ in relation to the main constituent.

In the laminated piezoelectric element of the present invention, Ag is contained in the piezoelectric layers preferably in a content of 0.05 to 0.8% by weight in terms of $Ag_2O$, and more preferably in a content of 0.2 to 0.5% by weight in terms of $Ag_2O$.

In addition to Ag, Ta is contained in the piezoelectric layers preferably in a content of 0.7% by weight or less (not inclusive of 0) in terms of oxide, and at least one selected from Sb, Nb and W is contained in the piezoelectric layers preferably in a content of 1.0% by weight or less (not inclusive of 0) in terms of oxide.

In the laminated piezoelectric element of the present invention, the Ag-containing internal electrode layers can be constituted of, for example, pure Ag or a Ag—Pd alloy. Because Pd is higher in cost than Ag, and because when the content of Pd is large, Pd undergoes during sintering an oxidation-reduction reaction to lead to a fear that cracks and delamination are thereby caused in the laminated piezoelectric element, thus the content of Pd in the Ag—Pd alloy is preferably 30% by mass or less. When a Ag—Pd alloy having a content of Pd of 30% by mass or less is used for the internal electrode layers, the sintering temperature is required to be set at 1150° C. or lower and preferably 1120° C. or lower on the basis of the Ag—Pd system phase diagram. For the purpose of further reducing the production cost, the content of Pd is required to be lowered, and for that purpose, the sintering temperature of the piezoelectric ceramic composition constituting the piezoelectric layers is required to be made as low as possible. Thus, in the present invention, the adoption of the above-mentioned composition makes it possible to use for the internal electrode layers a Ag—Pd alloy having a content of Pd of 20% by mass or less. As shown in the examples to be described below, the laminated piezoelectric element of the present invention is sufficiently densified even when sinterd at low temperatures of 1000° C. or lower, exhibits high piezoelectric properties, and is large in the displacement magnitude at high voltages.

The laminated piezoelectric element production method of the present invention includes a step of obtaining a laminate by alternately laminating piezoelectric layer precursors containing at least the raw material composition for the above-mentioned main constituent and Ag-component-containing internal electrode layer precursors; and a step of sintering the thus obtained laminate. The sintering temperature can be set, for example, at 800 to 1000° C.

For the purpose of making a predetermined amount of Ag present in the piezoelectric layers after sintering, the Ag-component may be added to the piezoelectric layer precursors. The mode of making a predetermined amount of Ag present in the piezoelectric layers after sintering is not limited to the above-mentioned mode; a part or the whole of the Ag contained in the piezoelectric layers may be ascribed to the diffusion, at the time of sintering, of a part of the Ag contained in the internal electrode layer precursors. Needless to say, by both of the diffusion and the addition, a predetermined amount of Ag may be made present in the piezoelectric layers after sintering.

According to the present invention, it is possible to provide a laminated piezoelectric element that is sufficiently densified even when sinterd at low temperatures of 1000° C. or lower, exhibits high piezoelectric properties and is high particularly in the piezoelectric properties at high voltages.

DETAILED DESCRIPTION OF THE PREFERRED EMBODIMENTS

Detailed description will be made below on the present invention on the basis of the embodiment shown in the accompanying drawings.

Figure 1:
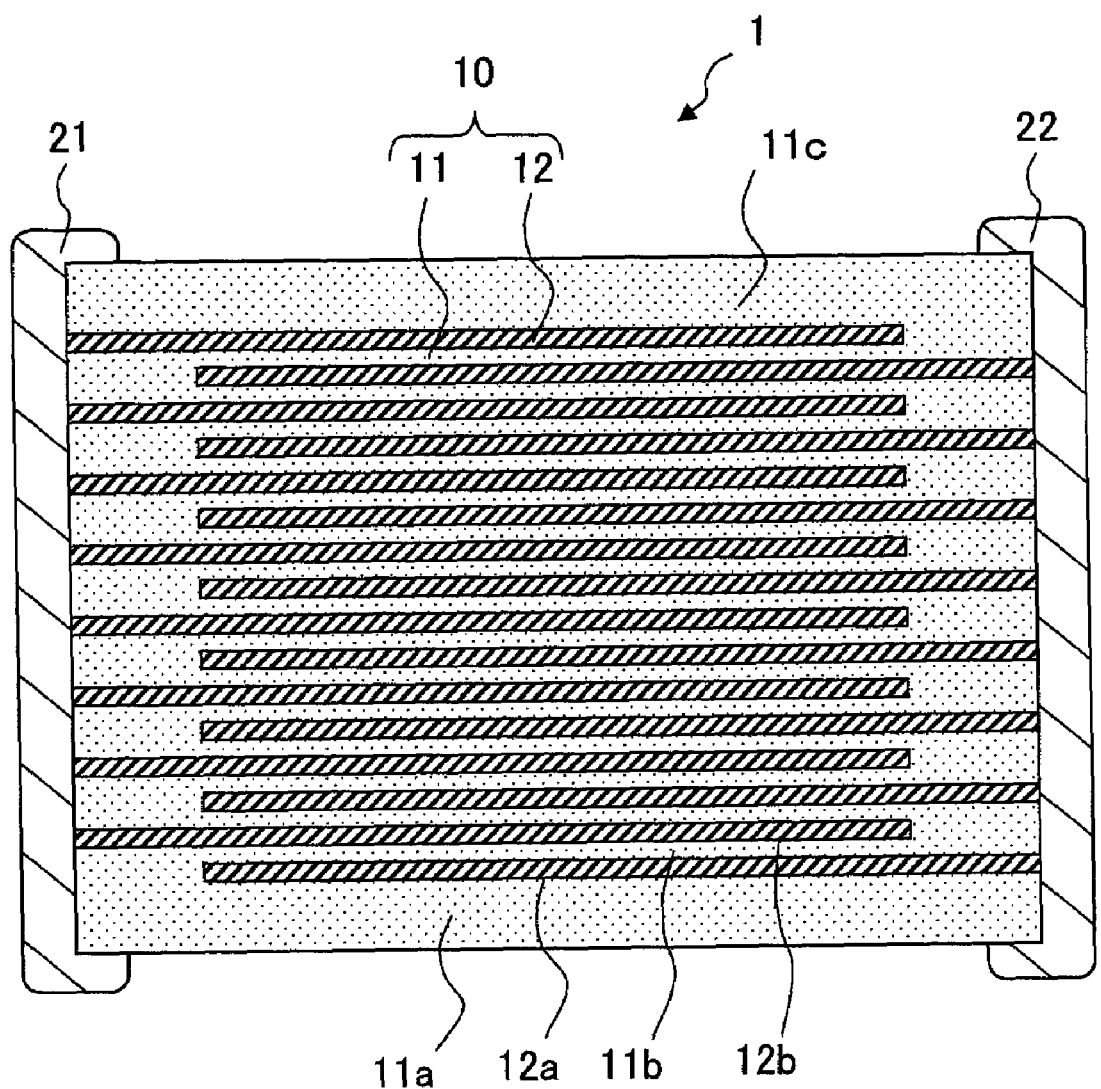
FIG. 1 is a view illustrating a construction example of a laminated piezoelectric element in an embodiment of the present invention.

FIG. 1 is a sectional view illustrating a construction example of a laminated piezoelectric element 1 obtained by the present invention. FIG. 1 shows one example, and needless to say, the present invention is not limited to the laminated piezoelectric element 1 shown in FIG. 1. The laminated piezoelectric element 1 has a laminate 10 in which a plurality of piezoelectric layers 11 and a plurality of internal electrode layers 12 are alternately laminated with each other. The thickness of one piezoelectric layer 11 is set, for example, at 1 to 200 μm, preferably at 20 to 150 μm, and more preferably at 50 to 100 μm. The lamination number of the piezoelectric layers 11 is determined according to the targeted displacement magnitude.

The piezoelectric ceramic composition constituting the piezoelectric layers 11 contains as a main constituent thereof a composite oxide represented by the following formula (1). It is to be noted that the oxygen composition in this formula has been derived stoichiometrically, and the actual composition is allowed to deviate from the stoichiometric composition.

$$(Pb_{a-b}M_b)[(Zn_{1/3}Nb_{2/3})_x Ti_y Zr_z]O_3 \quad (1)$$

wherein $0.96 \leq a \leq 1.03$, $0 \leq b \leq 0.1$, $0.05 \leq x \leq 0.15$, $0.25 \leq y \leq 0.5$, $0.35 \leq z \leq 0.6$, $x+y+z=1$, and M represents at least one selected from Sr, Ca and Ba.

The above-mentioned composite oxide has a so-called perovskite structure, wherein Pb in formula (1) is located at the so-called A-site in the perovskite structure, and Zn, Nb, Ti and Zr are located at the so-called B-site in the perovskite structure.

In the composite oxide represented by formula (1), the A-site element ratio "a" satisfies $0.96 \leq a \leq 1.03$. When the A-site element ratio "a" is less than 0.96, there is a fear that sintering at low temperatures becomes difficult. When the A-site element ratio "a" exceeds 1.03, the density of the piezoelectric ceramic to be obtained is degraded, and consequently, there is a fear that no sufficient piezoelectric properties are attained and the mechanical strength is also degraded. The A-site element ratio "a" more preferably satisfies $0.97 \leq a \leq 1.02$, and furthermore preferably $0.99 \leq a \leq 1.000$.

By partially substituting Pb with the substitutional element M (Sr, Ca, Ba), the piezoelectric strain constant can be made larger. However, when the substitution amount b of the substitutional element M becomes too large, the sinterability is degraded, and consequently the piezoelectric strain constant becomes small and the mechanical strength is also degraded. The Curie temperature also tends to be decreased with the increase of the substitution amount b. Consequently, the substitution amount b of the substitutional element M is preferably set at 0.1 or less, more preferably at 0.06 or less, and furthermore preferably 0.005 to 0.04.

Among the ratios of the B-site elements, the ratio x of Zn and Nb is preferably set to satisfy $0.05 \leq x \leq 0.15$. The ratio x affects the sintering temperature; when the value of x is less than 0.05, there is a fear that the effect of lowering the sintering temperature is attained only to an insufficient extent. When the value of x exceeds 0.15, the sinterability is affected by such an x value, leading to a fear that the piezoelectric strain constant becomes small and the mechanical strength is degraded. The ratio x of Zn and Nb more preferably satisfies $0.06 \leq x \leq 0.125$ and furthermore preferably $0.08 \leq x \leq 0.1$.

Among the ratios of the B-site elements, the preferable ranges for the ratio y of Ti and the ratio z of Zr are set from the viewpoint of the piezoelectric properties. Specifically, the ratio y of Ti satisfies $0.25 \leq y \leq 0.5$, and the ratio z of Zr satisfies $0.35 \leq z \leq 0.6$. By setting these ratios to fall within the above-mentioned ranges, there can be obtained a large piezoelectric strain constant in the vicinity of the morphotropic phase boundary (MPB). The ratio y of Ti preferably satisfies $0.275 \leq y \leq 0.48$, and more preferably $0.3 \leq y \leq 0.45$. The ratio z of Zr preferably satisfies $0.375 \leq z \leq 0.55$, and more preferably $0.4 \leq z \leq 0.5$.

The above-mentioned piezoelectric ceramic composition may contain an additive in addition to the above-mentioned main constituent; for example, at least one selected from Ta, Sb, Nb and W can be used as an additive. The addition of this additive can improve the piezoelectric properties and the mechanical strength. However, when the addition amount of this additive falls outside a predetermined range, there is a fear that the sinterability is degraded and the piezoelectric properties are thereby degraded. Accordingly, the addition amount of Ta is preferably set at 0.7% by weight or less in terms of $Ta_2O_5$, the addition amount of Sb is preferably set at 1.0% by weight or less in terms of $Sb_2O_3$, the addition amount of Nb is preferably set at 1.0% by weight or less in terms of $Nb_2O_5$, and the addition amount of W is preferably set at 1.0% by weight or less in terms of $WO_3$. The content of Ta in terms of $Ta_2O_5$ is preferably 0.05 to 0.6% by weight and more preferably 0.15 to 0.5% by weight. Each of the contents of Sb, Nb and W respectively in terms of the above-mentioned oxides is preferably 0.05 to 0.5% by weight and more preferably 0.1 to 0.4% by weight.

The internal electrode layers 12 contain Ag as a conductive material. As described above, even when the piezoelectric ceramic composition constituting the piezoelectric layers 11 is sintered at low temperatures of 900 to 1000° C., a sintered body sufficiently high in density can be obtained, and high piezoelectric properties are exhibited. Accordingly, in the present invention, as the conductive material constituting the internal electrode layers 12, pure Ag or a Ag—Pd alloy (the content of Pd in the Ag—Pd alloy is 20% by mass or less) can be used. As described above, Ag is lower in price than Pd; thus, when a Ag—Pd alloy is used for the internal electrodes, the price reduction of the internal electrode material can be attained by reducing the content of Pd to be 20% by mass or less, preferably 10% by mass or less, and more preferably 5% by mass or less. It is to be noted that when the content of Pd in the Ag—Pd alloy is 10% by mass or less, the sintering temperature is required to be set at 980° C. or lower, and when the content of Pd in the Ag—Pd alloy is 5% by mass or less, the sintering temperature is required to be set at 950° C. or lower. The piezoelectric layers 11 which contain the composite oxide represented by formula (1) as the main constituent and $Ag_2O$ within the content range recommended in the present invention can be sintered at 980° C. or lower, and further, even at 950° C. or lower.

The plurality of internal electrode layers 12 are, for example, alternately extended in opposite directions, and a pair of terminal electrodes 21 and 22 are disposed to be electrically connected to the alternate extension ends of the internal electrode layers 12, respectively. The terminal electrodes 21 and 22 are, for example, electrically connected to an external power supply not shown in the figure through the lead wires not shown in the figure.

The terminal electrodes 21 and 22 may be formed by sputtering with Cu, or alternatively, by baking a paste for the terminal electrodes. The thickness of each of the terminal electrodes 21 and 22 is appropriately determined according to the intended purposes, and is usually 10 to 50 μm.

The above descriptions give the fundamental construction of the laminated piezoelectric element 1 of the present invention. One of the features of the laminated piezoelectric element 1 of the present invention is the fact that the piezoelectric layers 11 contain Ag in a content of 1.0% by weight or less (not inclusive of 0) in terms of $Ag_2O$. Hereinafter, description will be made on this feature.

The piezoelectric layers 11 contain Ag in a content of 1.0% by weight or less (not inclusive of 0) in terms of $Ag_2O$, and the sinterability is thereby improved in such a way that even sintering at 1000° C. or lower can yield a sintered body sufficiently high in density and the piezoelectric properties are improved. Specifically, it has been found that, in the laminated piezoelectric element 1 in which the piezoelectric layers 11 contain a predetermined content of $Ag_2O$, the improvement degree of the piezoelectric properties at high voltages (1 to 3 kV/mm) is remarkable as compared to the improvement degree of the piezoelectric properties at low voltages (1 V/mm or lower).

Because the laminated piezoelectric element 1 is driven at high voltages (1 to 3 kV/mm), it is necessary to attain satisfactory piezoelectric properties at high voltages. There are two or more physical property values to evaluate the piezoelectric properties; however, when laminated piezoelectric elements 1 are used, the electromechanical coupling coefficient k31(%) and the displacement magnitude are significant. Because it is cumbersome to evaluate materials by giving the materials displacements at such high voltages, usually displacements are not measured, but actually a simple impedance measurement and a measurement with a d33 meter are carried out at a low voltage (1 V/mm or lower). By assuming that the piezoelectric properties at a low voltage and the piezoelectric properties at a high voltage link with each other, evaluation of the piezoelectric ceramic compositions has hitherto been carried out. However, as described above, the present invention has found that the improvement of the piezoelectric properties at high voltages is remarkable when a predetermined amount of $Ag_2O$ is contained in relation to the above-mentioned main constituent composition. The reason for such an improvement of the piezoelectric properties is not clear at present, but the conceivable interpretation is such that involved is the grain growth promoted by the Ag contained in a predetermined amount in the piezoelectric layers 11.

However, when Ag is contained in an amount exceeding 1.0% by weight in terms of $Ag_2O$, the improvement effect of the piezoelectric properties at high voltages is made smaller, and accordingly the content of Ag is set at 1.0% by weight or less in terms of $Ag_2O$. The content of Ag is more preferably 0.05 to 0.8% by weight in terms of $Ag_2O$. It is to be noted that in above-mentioned Patent Document 2, as shown in an example thereof, when the addition amount of $Ag_2O$ is 0.005% by weight, the highest piezoelectric property kr is exhibited to give a kr value of 64%; in view of the piezoelectric property kr of 63% found for a sample without $Ag_2O$ added therein, the effect of the piezoelectric property improvement attributable to the addition of $Ag_2O$ can be little observed. On the contrary, in the present invention that adopts the composition represented by above formula (1), as shown in the examples to be described below, the piezoelectric property improvement effect due to the addition of $Ag_2O$ is significant, and in particular, such an effect is remarkable when the content of Ag is 0.2 to 0.5% by weight in terms of $Ag_2O$.

The $Ag_2O$ contained in the piezoelectric layers 11 may be provided by the diffusion of the $Ag_2O$ contained in the internal electrode layers 12 into the piezoelectric layers 11, or may be provided by the addition of $Ag_2O$ at the time of preparation of the raw material for the piezoelectric layers 11. The $Ag_2O$ contained in the piezoelectric layers 11 may also be provided by both of the diffusion and the addition. In the present invention, essential is the $Ag_2O$ contained in the piezoelectric layers 11, but the way of addition thereof or the form of presence thereof is not significant. It is to be noted that the diffusion of $Ag_2O$ into the piezoelectric layers 11 has been verified in Example 10.

Figure 2:
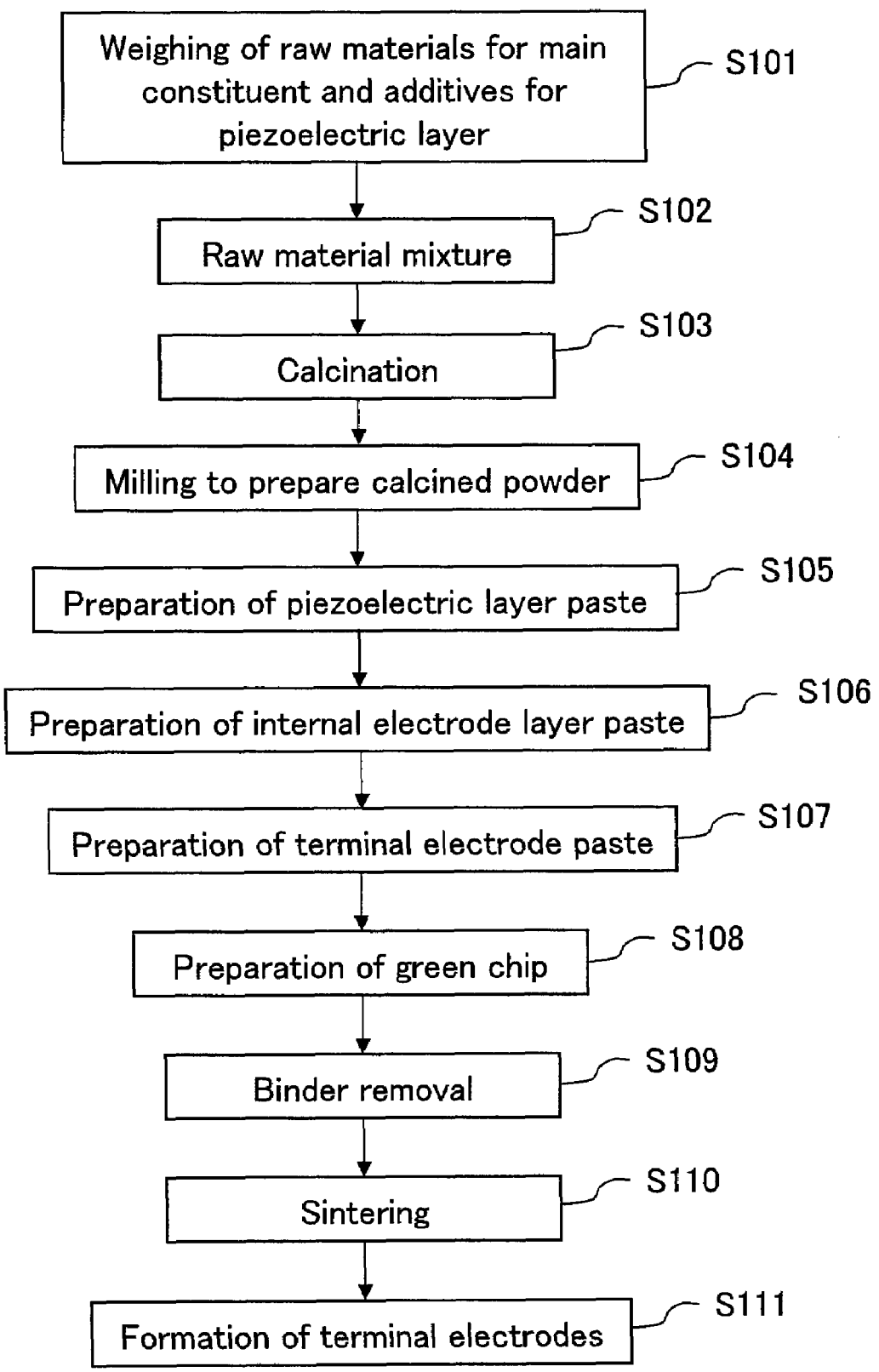
FIG. 2 is a flow chart showing production procedures of the laminated piezoelectric element in the embodiment of the present invention.

Next, description will be made on a preferable production method of the laminated piezoelectric element 1 with reference to FIG. 2. FIG. 2 is a flow chart showing a production process of the laminated piezoelectric element 1.

First, as the starting materials for the main constituent for obtaining the piezoelectric layers 11, for example, the following are prepared and weighed out: the powders of PbO, $TiO_2$, $ZrO_2$, ZnO and $Nb_2O_5$, or the compounds that can be converted into these oxides by sintering; and the powder of at least one oxide selected from SrO, BaO and CaO or one selected from the compounds that can be converted into these oxides by sintering and the like (step S101). As the starting materials, instead of oxides, carbonates and oxalates that are converted into oxides by sintering may also be used. The raw material powders having a mean particle size of approximately 0.5 to 10 μm are usually used.

When Ag is contained in the piezoelectric layers 11 through the mode of addition, Ag or $Ag_2O$ is prepared as the addition species of Ag in addition to the above-mentioned starting materials.

In addition to the starting materials for the main constituent and the essential additive Ag, starting materials for additives other than Ag are prepared, if needed, and weighed out (step S101). As the starting material for the additive, there can be used at least one oxide selected from $Ta_2O_5$, $Sb_2O_3$, $Nb_2O_5$ and $WO_3$, or a compound capable of being converted into each of these oxides by sintering. As the starting materials, instead of oxides, carbonates and oxalates that are converted into oxides by sintering may also be used. These additives improve the sinterability and provide the effect of making lower the sintering temperature.

Subsequently, the starting materials for the main constituent and the additive(s) are wet milled and mixed, for example, with a ball mill to yield the raw material mixture (step S102).

The starting material(s) for the additive(s) may be added before the calcination (step S103) to be described below, or may be designed to be added after the calcination. It is to be noted that the addition of Ag among the additives before the calcination is advantageous for the purpose of attaining high densification because the more homogeneous piezoelectric layers 11 can thereby be prepared; however, when added after calcination, the improvement effect of the piezoelectric properties is significant, and also when added after calcinations. Oxides are preferably used for the starting materials for the additives.

Next, the raw material mixture is dried and calcined, for example, at temperatures of 750 to 950° C. for 1 to 6 hours (step S103). This calcination may be carried out in air, in an atmosphere having an oxygen partial pressure higher than that in air, or in an atmosphere of pure oxygen. After calcination, the calcined mixture is wet milled and mixed, for example, with a ball mill to yield a calcined powder containing the main constituent and, if needed, additive(s) (step S104).

Next, the calcined powder is added with a binder to prepare a piezoelectric layer paste (step S105). Specifically, the involved procedures are as follows: first, for example, with a ball mill, a slurry is prepared by wet milling; at this time, as the solvent for the slurry, water, alcohols such as ethanol, or a mixed solvent composed of water and ethanol can be used; and the wet milling is preferably carried out until the mean particle size of the calcined powder becomes approximately 0.5 to 2.0 μm.

Next, the obtained slurry is dispersed in an organic vehicle. The organic vehicle means a mixture in which a binder is dissolved in an organic solvent. No particular constraint is imposed on the binders usable for the organic vehicle; such a binder may be appropriately selected from common various binders such as ethyl cellulose, polyvinyl butyral and acryl. Also, no particular constraint is imposed on the organic solvent concerned; such a solvent may be appropriately selected from organic solvents such as terpineol, butylcarbitol, acetone, toluene and MEK (methyl ethyl ketone), according to the method to be applied such as a printing method and a sheet forming method.

When the piezoelectric layer paste is made to take a form of an aqueous coating composition, the calcined powder may be kneaded with an aqueous vehicle in which a water-soluble binder, a water-soluble dispersant or the like is dissolved in water. No particular constraint is imposed on the water-soluble binder to be used for the aqueous vehicle; for example, polyvinyl alcohol, cellulose, a water-soluble acrylic resin or the like may be used.

Additionally, a Ag-containing internal electrode layer paste is also prepared (step S106).

The internal electrode layer paste is prepared by kneading Ag or a Ag—Pd alloy with the above-mentioned organic vehicle.

In the sintering step to be described below, the Ag contained in the internal electrode layer paste partially diffuses into the piezoelectric layers 11 to be formed by sintering of the piezoelectric layer paste. In this way, there is attained a condition in which $Ag_2O$ is contained in the piezoelectric layers 11, and thus the laminated piezoelectric element 1 of the present invention is fabricated. It is to be noted that even when the Ag contained in the internal electrode layer paste is not pure Ag but a Ag—Pd alloy, it is not Pd but only Ag that diffuses during sintering.

A terminal electrode paste is also prepared in the same manner as the internal electrode layer paste (step S107).

In the above-mentioned case, the piezoelectric layer paste, the internal electrode layer paste and the terminal electrode paste are prepared sequentially in this order; however, needless to say, these pastes may be prepared in parallel with each other or in a reversed order.

No particular constraint is imposed on the content of the organic vehicle in each of the pastes; the content concerned may be such that the content of the binder is approximately 5 to 10% by mass and the content of the solvent is approximately 10 to 50% by mass. Additionally, each of the pastes may contain additives selected from various dispersants, plasticizers, dielectrics, insulators and the like, if needed.

Next, by using the above-mentioned pastes, a green chip (laminate) to be sintered is fabricated (step S108).

When the green chip is fabricated by means of a printing method, the piezoelectric layer paste is printed two or more times, in a predetermined thickness for each time, for example, on a substrate made of polyethylene terephthalate or the like, to form an outside piezoelectric layer 11a in a green state as shown in FIG. 1. Then, on the outside piezoelectric layer 11a in a green state, the internal electrode layer paste is printed in a predetermined pattern to form an internal electrode layer (an internal electrode layer precursor) 12a in a green state. Then, on the internal electrode layer 12a in a green state, the piezoelectric layer paste is printed two or more times, in a predetermined thickness for each time, in the same manner as described above, to form a piezoelectric layer (a piezoelectric layer precursor) 11b in a green state. Then, on the piezoelectric layer 11b in a green state, the internal electrode layer paste is printed in a predetermined pattern, to form an internal electrode layer 12b in a green state. The internal electrode layers 12a and 12b each in a green state are formed so as to be exposed respectively to the different terminal surfaces facing each other. The above-mentioned operations are repeated predetermined number of times, and finally, on the internal electrode layer 12 in a green state, the piezoelectric layer paste is printed, in the same manner as described above, predetermined number of times, in a predetermined thickness for each time, to form the outside piezoelectric layer 11c in a green state. Hereafter, the laminate thus obtained is pressurized and bonded under pressure while being heated, and then cut into a predetermined shape to form a green chip (laminate).

In the above case, description is made on the fabrication of a green chip by means of a printing method; however, such a green chip can also be fabricated by means of a sheet forming method.

Next, the green chip is subjected to a binder removal treatment (step S109).

In the binder removal treatment, the atmosphere of the binder removal is needed to be determined according to the conductive material in the internal electrode layer precursor; however, the present invention uses pure Ag or a Ag—Pd alloy as the conductive material, and hence is not required to take oxidation into consideration, so that the binder removal treatment may be carried out in air, in an atmosphere having an oxygen partial pressure higher than that in air, or in an atmosphere of pure oxygen.

When the binder removal treatment temperature is lower than 300° C., the binder removal cannot be carried out smoothly. Also, when the binder removal treatment temperature exceeds 650° C., no binder removal effect commensurate with such a high temperature can be obtained to result in a waste of energy. The binder removal treatment time is needed to be determined according to the temperature and the atmosphere; the binder removal treatment time can be selected to fall within a range from 0.5 to 50 hours. Further, the binder removal treatment may be carried out separately and independently from the sintering, or may be carried out continuously with the sintering. When the binder removal treatment is carried out continuously with the sintering, the binder removal treatment may be carried out in the course of the temperature elevation in sintering.

After the binder removal treatment, the sintering (step S110) is carried out.

Similarly to the binder removal, the sintering may be carried out in air, in an atmosphere having an oxygen partial pressure higher than that in air, or in an atmosphere of pure oxygen. The present invention uses pure Ag or a Ag—Pd alloy as the internal electrode material, and hence is not required to take oxidation into consideration, without excluding the sintering in a reductive atmosphere. Even when the sintering is carried out in a reductive atmosphere, the Ag contained in the internal electrode layer paste partially diffuses into the piezoelectric layers 11 during sintering.

The sintering temperature can be appropriately set within a range from 800 to 1000° C. The piezoelectric ceramic composition to constitute the piezoelectric layers 11 is capable of being sintered at low temperatures as described above; however, a sintering at 800° C. or lower can hardly yield a dense sintered body. On the other hand, a sintering at a temperature exceeding 1000° C. necessitates the increase of the content of Pd in the Ag—Pd alloy, resulting in a price rise of the internal electrode material, and the increased sintering temperature increases the equipment cost and others, so as to hinder the price reduction of piezoelectric elements. It is to be noted that the sintering temperature is determined on the basis of the prerequisite that a dense sintered body be obtained and the conductive material constituting the internal electrode layers 12 be not melted. When the internal electrode layers 12 are constituted with pure Ag, the sintering of the laminate 10 is carried out, needless to say, at temperatures lower than the melting point of Ag (961° C.). The sintering time may be appropriately set within a range from 1 to 5 hours.

The laminate 10 fabricated by carrying out the above-mentioned steps is subjected to end-face polishing by means of, for example, barrel polishing or sandblast, and then the terminal electrodes 21 and 22 are formed by printing or baking the above-mentioned terminal electrode paste (step S111). The terminal electrodes 21 and 22 can also be formed by sputtering instead of printing or baking.

In the above described manner, the laminated piezoelectric element 1 shown in FIG. 1 can be obtained.

EXAMPLE 1

Each of the piezoelectric ceramic composition samples shown in Table 1 was prepared by adding $Ag_2O$ in the amount shown in Table 1 in relation to the following main constituent, and was subjected to the evaluation of the piezoelectric properties.

Main constituent:

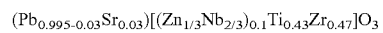

$(Pb_{0.995-0.03}Sr_{0.03})[(Zn_{1/3}Nb_{2/3})_{0.1}Ti_{0.43}Zr_{0.47}]O_3$

Each of the piezoelectric ceramic composition samples shown in Table 1 was prepared as follows. First, as the raw materials for the main constituent, a PbO powder, a $SrCO_3$ powder, a ZnO powder, a $Nb_2O_5$ powder, a $TiO_2$ powder and a $ZrO_2$ powder were prepared, and were weighed out to give the above-mentioned composition of the main constituent. Additionally, a $Ta_2O_5$ powder was added in a content of 0.4% by weight in relation to the main constituent. Then, these raw materials were wet mixed with a ball mill for 16 hours, and calcined in air at 700 to 900° C. for 2 hours.

The calcined mixture thus obtained was pulverized, added with a $Ag_2O$ powder as the addition species of Ag in a content shown in Table 1 in relation to the main constituent, and then wet milled with a ball mill for 16 hours. Then, the milled mixture was dried, added with polyvinyl alcohol as a binder, and then granulated. The granulated mixture was compacted into a rectangular plate of 20 mm in length, 20 mm in width and 1 mm in thickness with a uniaxial press molding machine under a pressure of approximately 392 MPa. After compacting, the rectangular plate was heat treated to evaporate the binder, and sintered in air at 960° C. for 2 hours. The thus obtained sintered body was subjected to lapping machining to prepare a rectangular plate of 0.5 mm in thickness. Then, a silver paste was printed on the both sides of the rectangular plate, and baked at 650° C. The rectangular plate was cut to the dimension of 15 mm in length and 15 mm in width with a dicing saw, and then subjected to a polarization treatment in a silicone oil set at 120° C. by applying an electric field of 3 kV for 15 minutes. The thus polarized rectangular plate was cut with a dicing saw to the dimension of 12 mm in length, 3 mm in width and 0.5 mm in thickness to yield a piezoelectric ceramic composition sample for use in evaluation.

The samples thus fabricated were subjected to the displacement magnitude d measurement at a high voltage and the electromechanical coupling coefficient k31 measurement at a low voltage to evaluate the piezoelectric properties of the samples.

The displacement magnitude of each of the samples at a high voltage was measured by applying a voltage of 1.3 kV/mm to the sample and by measuring the resulting displacement with a laser Doppler displacement gauge. The displacement magnitude of each of the samples, at the applied voltage of 1.3 kV/mm, along the lengthwise direction per 1 mm of the element was represented by D [μm/mm], and the displacement magnitude per unit voltage d was derived from d=D×1000/1.3 V.

The electromechanical coupling coefficient k31 measurement was carried by using an impedance analyzer (HP4194A, manufactured by Hewlett-Packard Co.), at an applied voltage of 0.2 V/mm.

Here, d and k31 of the sample in which $Ag_2O$ was not added are represented by $d_{STD}$ and $k31_{STD}$, respectively. For each of the other samples, the $(d/k31)/(d_{STD}/k31_{STD})$ value was derived; the rates of change derived from this formula indicate the improvement degree of the piezoelectric properties at the high voltage as compared to the sample in which $Ag_2O$ was not added. A simultaneous consideration of the electromechanical coupling coefficients k31 and $k31_{STD}$ at the low voltage and the displacement magnitudes d and $d_{STD}$ at the high voltage makes it possible to evaluate the improvement degree of the piezoelectric properties at the high voltage relative to the piezoelectric properties at the low voltage. The larger is the rate of change $(d/k31)/(d_{STD}/k31_{STD})$ than 1, the addition of $Ag_2O$ is evaluated to provide the higher improvement degree of the piezoelectric properties at the high voltage.

Additionally, the sintered body density of each of the prepared samples was measured.

Figure 3:
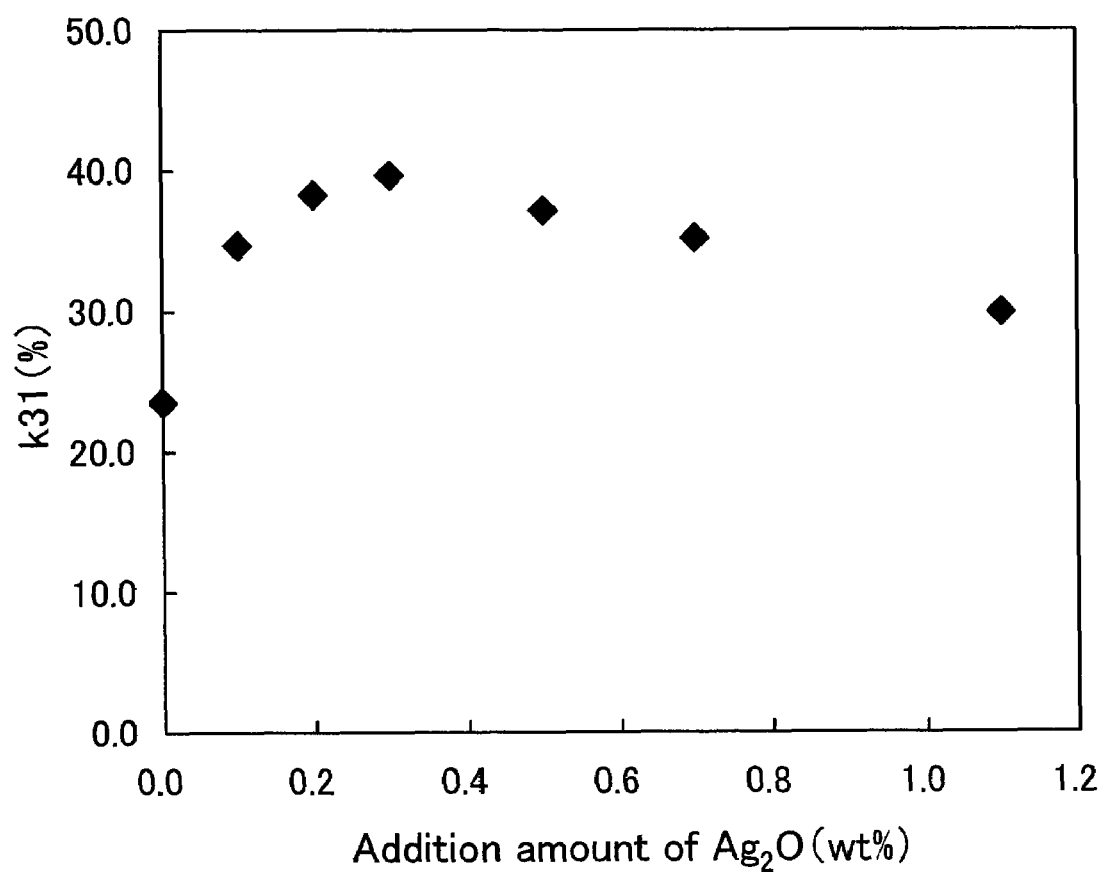
FIG. 3 is a graph showing the relation between the addition amount of $Ag_2O$ and the electromechanical coupling coefficient k31.
Figure 4:
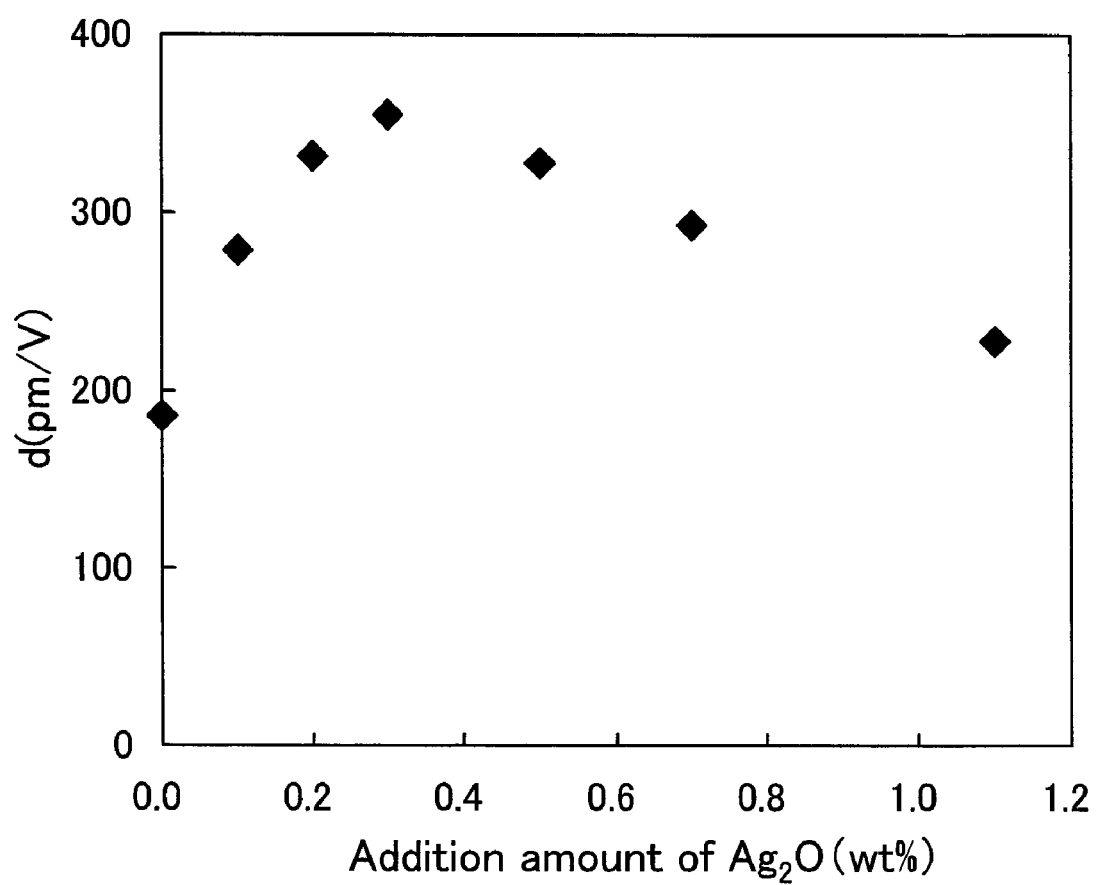
FIG. 4 is a graph showing the relation between the addition amount of $Ag_2O$ and the displacement magnitude d.
Figure 5:
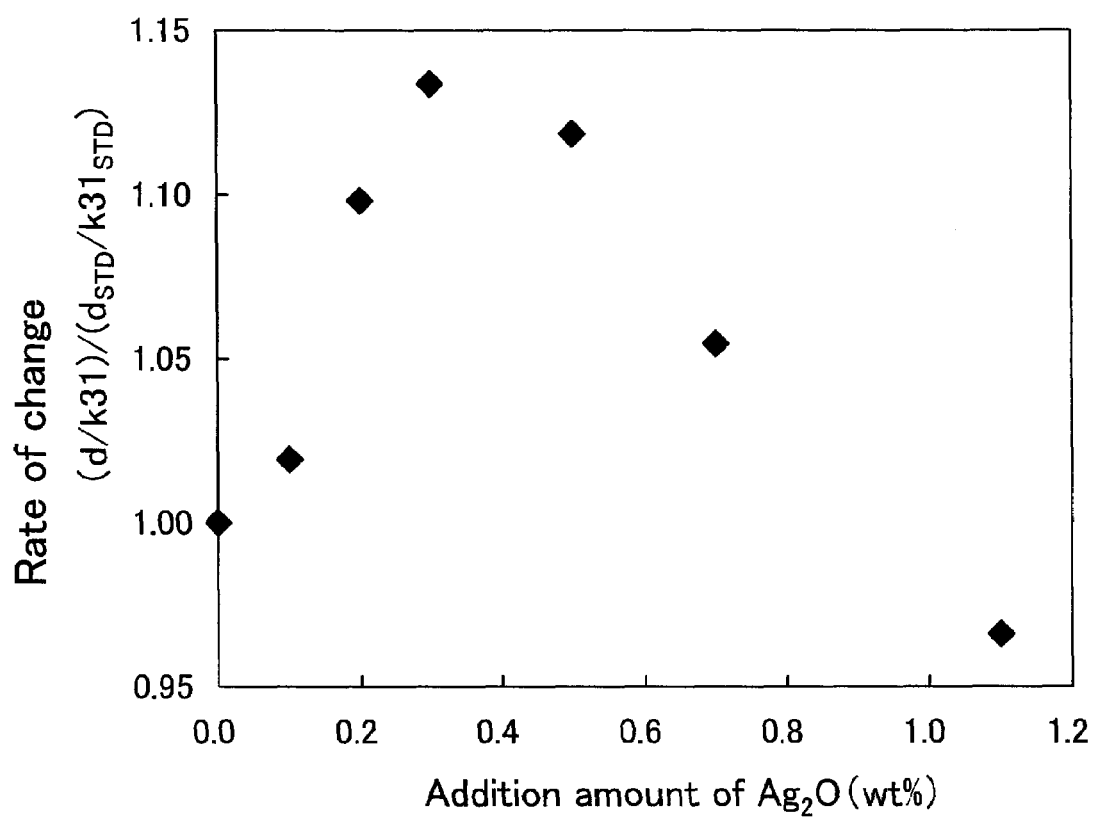
FIG. 5 is a graph showing the relation between the addition amount of $Ag_2O$ and the ratio of the change $(d/k31)/(d_{STD}/k31_{STD})$.

The above-mentioned results are shown in Table 1; the relation between the addition amount of $Ag_2O$ and the electromechanical coupling coefficient k31 is shown in FIG. 3, the relation between the addition amount of $Ag_2O$ and the displacement magnitude d is shown in FIG. 4, and the relation between the addition amount of $Ag_2O$ and the rate of change $(d/k31)/(d_{STD}/k31_{STD})$ is shown in FIG. 5.

TABLE 1

| Addition amount of $Ag_2O$ (wt %) | Density (g/cm³) | k31 (%) | d (pm/V) | Rate of change $(d/k31)/(d_{STD}/k31_{STD})$ |
|---|---|---|---|---|
| 0 | 7.32 | 23.5 | 186 | 1.00 |
| 0.10 | 7.54 | 34.7 | 279 | 1.02 |
| 0.20 | 7.84 | 38.3 | 332 | 1.10 |
| 0.30 | 7.86 | 39.7 | 355 | 1.13 |
| 0.50 | 7.84 | 37.2 | 328 | 1.12 |
| 0.70 | 7.84 | 35.2 | 293 | 1.05 |
| 1.10 | 7.84 | 29.9 | 228 | 0.97 |

As can be seen from Table 1, the addition of $Ag_2O$ improved the sintered body density. When the addition amount of $Ag_2O$ was 0.2% by weight or more, the relative densities were 97% or more of the theoretical density of 8.04 g/cm³, showing that the sintering was carried out to a sufficient degree.

Additionally, as shown in FIG. 3, the addition of $Ag_2O$ improved the electromechanical coupling coefficient k31; in particular, when the addition amount of $Ag_2O$ was 0.2 to 0.5% by weight, the exhibited electromechanical coupling coefficients k31 were as high as 37.0% or more, resulting in an improvement by approximately 15% as compared to the case without addition of $Ag_2O$.

Further, as shown in FIG. 4, the addition of $Ag_2O$ improved the displacement magnitude d at the high voltage; in particular, the displacement magnitude d was large when the addition amount of $Ag_2O$ fell within a range from 0.05 to 1.0% by weight.

As shown in FIG. 5, the improvement of the piezoelectric properties at the high voltage was remarkable when the addition amount of $Ag_2O$ fell within a range from 0.05 to 1.0% by weight; however, the rate of change $(d/k31)/(d_{STD}/k31_{STD})$ was lower when the addition amount of $Ag_2O$ reached 1.1% by weight than when $Ag_2O$ was not added.

Consequently, the content of Ag is preferably 0.05 to 1.0% by weight in terms of $Ag_2O$. The content of Ag in terms of $Ag_2O$ is more preferably 0.05 to 0.8% by weight and furthermore preferably 0.2 to 0.5% by weight. It is to be noted that the content of $Ag_2O$ in each of the samples was found to be in agreement with the addition amount of $Ag_2O$ (this was also the case for any of the examples to be described below).

EXAMPLE 2

Each of the piezoelectric ceramic composition samples shown in Table 2 was prepared by adopting the main constituent composition shown below and by varying a in the composition, in the same manner as in Example 1; the calcined mixture was pulverized, and then $Ag_2O$ was added in a content of 0.30% by weight. For each of the piezoelectric ceramic composition samples thus obtained, the displacement magnitude d at the high voltage and the rate of change $(d/k31)/(d_{STD}/k31_{STD})$ were obtained in the same manner as in Example 1. The results thus obtained are shown in Table 2. It is to be noted that the $(d_{STD}/k31_{STD})$ values for these samples were obtained from the samples in which the main constituent "a" values were 0.96, 0.98, 0.995, 1.005 and 1.03, and $Ag_2O$ was not contained.

Main constituent:

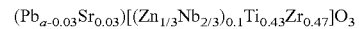

$(Pb_{a-0.03}Sr_{0.03})[(Zn_{1/3}Nb_{2/3})_{0.1}Ti_{0.43}Zr_{0.47}]O_3$

TABLE 2

| Main constituent composition a | Addition amount of $Ag_2O$ (wt %) | d (pm/V) | Rate of change $(d/k31)/(d_{STD}/k31_{STD})$ |
|---|---|---|---|
| 0.960 | 0.30 | 277 | 1.01 |
| 0.980 | | 316 | 1.07 |
| 0.995 | | 355 | 1.13 |
| 1.005 | | 333 | 1.10 |
| 1.030 | | 256 | 1.02 |

As shown in Table 2, the piezoelectric properties were able to be ensured within the range of "a" from 0.96 to 1.03. When "a" was less than 0.96 or exceeded 1.03, the rate of change was less than 1.00, and the improvement effect of the piezoelectric properties, due to the addition of $Ag_2O$, was degraded; "a" is preferably 0.97 to 1.02 and more preferably 0.99 to 1.00.

EXAMPLE 3

Each of the piezoelectric ceramic composition samples shown in Table 3 was prepared by adopting the main constituent composition shown below and by varying b in the composition, in the same manner as in Example 1; the calcined mixture was pulverized, and then $Ag_2O$ was added in a content of 0.30% by weight. For each of the piezoelectric ceramic composition samples thus obtained, the displacement magnitude d at the high voltage and the rate of change $(d/k31)/(d_{STD}/k31_{STD})$ were obtained in the same manner as in Example 1. The results thus obtained are shown in Table 3. It is to be noted that the $(d_{STD}/k31_{STD})$ values for these samples were obtained from the samples in which the main constituent b values were 0, 0.01, 0.03, 0.06 and 0.1, and $Ag_2O$ was not contained.

Main constituent:

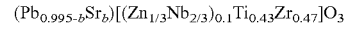

$(Pb_{0.995-b}Sr_b)[(Zn_{1/3}Nb_{2/3})_{0.1}Ti_{0.43}Zr_{0.47}]O_3$

TABLE 3

| Main constituent composition b | Addition amount of $Ag_2O$ (wt %) | d (pm/V) | Rate of change $(d/k31)/(d_{STD}/k31_{STD})$ |
|---|---|---|---|
| 0.00 | 0.30 | 290 | 1.19 |
| 0.01 | | 350 | 1.16 |
| 0.03 | | 355 | 1.13 |
| 0.06 | | 339 | 1.11 |
| 0.10 | | 294 | 1.04 |

As shown in Table 3, the piezoelectric properties were able to be ensured within the range of b from 0 to 0.1. When b was larger than 0, namely, Sr was contained as the main constituent, the displacement magnitude d was increased; however, when b exceeds 0.1, there is a fear that the displacement magnitude d becomes smaller than the displacement magnitude value for b=0. Also, when b exceeds 0.1, the piezoelectric property improvement effect due to the addition of $Ag_2O$ cannot be fully enjoyed; b is preferably 0 to 0.06 and more preferably 0.01 to 0.03.

EXAMPLE 4

Each of the piezoelectric ceramic composition samples shown in Table 4 was prepared in the same manner as in Example 1 except that the raw materials were prepared so as for the M in the main constituent shown below to be the elements specified in Table 4. For each of the piezoelectric ceramic composition samples thus obtained, the displacement magnitude d at the high voltage and the rate of change $(d/k31)/(d_{STD}/k31_{STD})$ were obtained in the same manner as in Example 1. The results thus obtained are shown in Table 4. It is to be noted that the $(d_{STD}/k31_{STD})$ values for these samples were obtained from the samples in which the M in the main constituent was Sr, Ca or Ba, and $Ag_2O$ was not contained.

Main constituent:

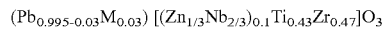

$(Pb_{0.995-0.03}M_{0.03})[(Zn_{1/3}Nb_{2/3})_{0.1}Ti_{0.43}Zr_{0.47}]O_3$

TABLE 4

| Main constituent composition species M | Addition amount of $Ag_2O$ (wt %) | d (pm/V) | Rate of change $(d/k31)/(d_{STD}/k31_{STD})$ |
|---|---|---|---|
| Sr | 0.30 | 355 | 1.13 |
| Ca |  | 331 | 1.09 |
| Ba |  | 341 | 1.11 |

As shown in Table 4, even when Ca or Ba was used as the substitutional element for Pb, similarly to the case where Sr was used, the improvement effect of the piezoelectric properties, due to the addition of $Ag_2O$, were also able to be enjoyed.

EXAMPLE 5

Each of the piezoelectric ceramic composition samples shown in Table 5 was prepared in the same manner as in Example 1 except that the raw materials were prepared so as for the x, y and z values in the main constituent shown below to be the values specified in Table 5. For each of the piezoelectric ceramic composition samples thus obtained, the displacement magnitude d at the high voltage and the rate of change $(d/k31)/(d_{STD}/k31_{STD})$ were obtained in the same manner as in Example 1. The results thus obtained are shown in Table 5. It is to be noted that the $(d_{STD}/k31_{STD})$ values for these samples were obtained from the samples in which $Ag_2O$ was not contained.

Main constituent:

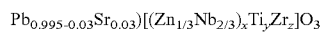

$Pb_{0.995-0.03}Sr_{0.03})[(Zn_{1/3}Nb_{2/3})_xTi_yZr_z]O_3$

TABLE 5

| Main constituent composition | | | Addition amount of $Ag_2O$ (wt %) | d (pm/V) | Rate of change $(d/k31)/(d_{STD}/k31_{STD})$ |
|---|---|---|---|---|---|
| x | y | z | | | |
| 0.05 | 0.43 | 0.52 | 0.30 | 365 | 1.15 |
|  | 0.50 | 0.45 |  | 330 | 1.10 |
| 0.10 | 0.43 | 0.47 |  | 355 | 1.13 |
|  | 0.45 | 0.45 |  | 319 | 1.08 |
|  | 0.50 | 0.40 |  | 303 | 1.06 |
| 0.15 | 0.45 | 0.40 |  | 321 | 1.08 |
| 0.05 | 0.35 | 0.60 |  | 311 | 1.07 |
| 0.15 | 0.50 | 0.35 |  | 297 | 1.04 |
| 0.15 | 0.25 | 0.60 |  | 294 | 1.02 |

As can be seen from Table 5, it was able to be verified that when the x, y and z for the B-site elements satisfied $0.05 \leq x \leq 0.15$, $0.25 \leq y \leq 0.5$ and $0.35 \leq z \leq 0.6$, respectively, the piezoelectric ceramic compositions excellent in the piezoelectric properties at the high voltage were able to be obtained, and the improvement effect of the piezoelectric properties, due to the addition of $Ag_2O$, was able to be enjoyed.

EXAMPLE 6

Each of the piezoelectric ceramic composition samples shown in Table 6 was prepared in the same manner as in Example 1 except that, after calcination, $Ag_2O$ was added in a content of 0.30% by weight and $Ta_2O_5$ in the contents specified in Table 6 in relation to the main constituent shown below. For each of the piezoelectric ceramic composition samples thus obtained, the displacement magnitude d at the high voltage and the rate of change $(d/k31)/(d_{STD}/k31_{STD})$ were obtained in the same manner as in Example 1. The results thus obtained are shown in Table 6. It is to be noted that the $(d_{STD}/k31_{STD})$ values for these samples were obtained from the samples in which $Ag_2O$ was not contained.

Main constituent:

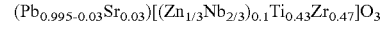

$(Pb_{0.995-0.03}Sr_{0.03})[(Zn_{1/3}Nb_{2/3})_{0.1}Ti_{0.43}Zr_{0.47}]O_3$

TABLE 6

| Addition amount of $Ta_2O_5$ (wt %) | Addition amount of $Ag_2O$ (wt %) | d (pm/V) | Rate of change $(d/k31)/(d_{STD}/k31_{STD})$ |
|---|---|---|---|
| 0.00 | 0.30 | 327 | 1.08 |
| 0.10 |  | 338 | 1.09 |
| 0.20 |  | 362 | 1.14 |
| 0.40 |  | 355 | 1.13 |
| 0.60 |  | 343 | 1.10 |
| 1.00 |  | 320 | 1.06 |

As shown in Table 6, although the displacement magnitude d at the high voltage was large owing to the inclusion of a predetermined amount of Ag even when $Ta_2O_5$ was not contained as an additive, the addition of $Ta_2O_5$ further improved the displacement magnitude d at the high voltage and the rate of change $(d/k31)/(d_{STD}/k31_{STD})$; however, the displacement magnitude d and the rate of change $(d/k31)/(d_{STD}/k31_{STD})$ were smaller when the addition amount of $Ta_2O_5$ reached 1.0% by weight than when $Ta_2O_5$ was not added; thus, when $Ta_2O_5$ is added, the addition amount thereof is set at 0.7% by weight or less. The addition amount of $Ta_2O_5$ is preferably 0.05 to 0.6% by weight and more preferably 0.15 to 0.5% by weight. It is to be noted that the content of $Ta_2O_5$ in each of the samples was found to be in agreement with the addition amount of $Ta_2O_5$.

EXAMPLE 7

Each of the piezoelectric ceramic composition samples shown in Table 7 was prepared in the same manner as in Example 1 except that, after calcination, $Ag_2O$ was added in a content of 0.30% by weight and $Sb_2O_3$, $Nb_2O_5$ or $WO_3$ in the content specified in Table 7 in relation to the main constituent shown below. For each of the piezoelectric ceramic composition samples thus obtained, the displacement magnitude d at the high voltage and the rate of change $(d/k31)/(d_{STD}/k31_{STD})$ were obtained in the same manner as in Example 1. The results thus obtained are shown in Table 7. It is to be noted that the $(d_{STD}/k31_{STD})$ values for these samples were obtained from the samples in which the addition species shown in Table 7 were not contained.

Main constituent:

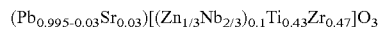

As shown in FIG. 7, the addition of $Sb_2O_3$, $Nb_2O_5$ or $WO_3$ as an additive improved the displacement magnitude d at the high voltage and the rate of change $(d/k31)/(d_{STD}/k31_{STD})$; however, there is a fear that the piezoelectric properties are degraded when the content of each of these additives exceeds 1.0% by weight than when any of these additives is not added. Accordingly, the content of each of these additives is preferably set at 1.0% by weight or less and more preferably 0.6% by weight or less.

EXAMPLE 8

Each of the piezoelectric ceramic composition samples shown in Table 8 was prepared in the same manner as in Example 1 except that, at the time of mixing of the raw material powders, $Ag_2O$ was added in the content specified in Table 8 in relation to the main constituent shown below. For each of the piezoelectric ceramic composition samples thus obtained, the displacement magnitude d at the high voltage and the rate of change $(d/k31)/(d_{STD}/k31_{STD})$ were obtained in the same manner as in Example 1. The results thus obtained are shown in Table 8. For the convenience of comparison, the displacement magnitude d at the high voltage and the rate of change $(d/k31)/(d_{STD}/k31_{STD})$ for the case where $Ag_2O$ was added after calcination are also shown in Table 8 for each of the samples. It is to be noted that the $(d_{STD}/k31_{STD})$ values for these samples were obtained from the samples in which $Ag_2O$ was not contained. It is also to be noted that the content of $Ag_2O$ in each of the samples was found to be in agreement with the addition amount of $Ag_2O$ irrespective of the addition timing of $Ag_2O$.

Main constituent:

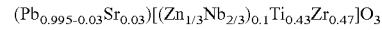

TABLE 8

| Addition amount of $Ag_2O$ (wt %) | Addition timing of $Ag_2O$ | Density (g/cm³) | k31 (%) | d (pm/V) | Rate of change $(d/k31)/(d_{STD}/k31_{STD})$ |
|---|---|---|---|---|---|
| 0 | — | 7.32 | 23.5 | 186 | 1.00 |
| 0.10 | At the time of mixing | 7.87 | 33.9 | 273 | 1.02 |
|  | After calcination | 7.54 | 34.7 | 279 | 1.02 |
| 0.30 | At the time of mixing | 7.85 | 39.5 | 350 | 1.13 |
|  | After calcination | 7.86 | 39.7 | 355 | 1.13 |
| 0.50 | At the time of mixing | 7.86 | 36.7 | 323 | 1.11 |
|  | After calcination | 7.84 | 37.2 | 328 | 1.12 |
| 0.70 | At the time of mixing | 7.87 | 35.2 | 288 | 1.04 |
|  | After calcination | 7.84 | 35.2 | 293 | 1.05 |
| 1.10 | At the time of mixing | 7.87 | 29.9 | 218 | 0.92 |
|  | After calcination | 7.84 | 29.9 | 228 | 0.97 |

TABLE 7

| Added species | Addition amount (wt %) | Addition amount of $Ag_2O$ (wt %) | d (pm/V) | Rate of change $(d/k31)/(d_{STD}/k31_{STD})$ |
|---|---|---|---|---|
| — | — | 0.30 | 327 | 1.08 |
| $Sb_2O_3$ | 0.10 |  | 338 | 1.09 |
|  | 0.30 |  | 361 | 1.14 |
|  | 0.50 |  | 352 | 1.12 |
| $Nb_2O_5$ | 0.10 |  | 374 | 1.16 |
|  | 0.30 |  | 359 | 1.14 |
|  | 0.50 |  | 349 | 1.10 |
| $WO_3$ | 0.05 |  | 359 | 1.13 |
|  | 0.10 |  | 357 | 1.13 |
|  | 0.50 |  | 346 | 1.11 |

As shown in Table 8, also when $Ag_2O$ was added at the time of mixing, similarly to Example 1 where $Ag_2O$ was added after calcination, the improvement of the sintered body density and the improvement of the piezoelectric properties at the high voltage as compared to the case where $Ag_2O$ was not added were able to be verified. When the addition amount of $Ag_2O$ was as small as 0.1% by weight, the addition at the time of mixing was able to give a higher sintered body density than the addition after calcination. Additionally, the displacement magnitude d was found to exhibit larger values by the addition after calcination.

Similarly to Example 1, also in the case where $Ag_2O$ was added at the time of mixing, when the addition amount of $Ag_2O$ reached 1.1% by weight, the improvement effect, due to the addition of $Ag_2O$, of the piezoelectric properties at the high voltage was not able to be enjoyed sufficiently.

EXAMPLE 9

Each of the samples shown in Table 9 was prepared, as far as the steps until the compacting were concerned, in the same manner as in Example 1 except that $Ag_2O$ was not added to the main constituent shown below. A $Ag_2O$ powder-containing Ag-paste was printed on the upper and lower surfaces of each of the thus obtained compacted bodies; the thickness values of the compacted bodies on which the Ag-paste was printed were set at four values shown in Table 9. Each of the samples was prepared in the same manner as in Example 1 except that the compacted bodies with the Ag-paste printed thereon were heat treated to evaporate the binder. For each of the samples thus obtained, the displacement magnitude d at the high voltage and the rate of change $(d/k31)/(d_{STD}/k31_{STD})$ were obtained in the same manner as in Example 1. The results thus obtained are shown in Table 9. It is to be noted that the $(d_{STD}/k31_{STD})$ values for these samples were obtained from the samples on which the Ag-paste was not printed.

Main constituent:

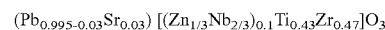

TABLE 9

| Compacted body thickness (mm) | Ag-paste coating | Diffusion amount of Ag$_2$O (wt %) | Density (g/cm$^3$) | k31 (%) | d (pm/V) | Rate of change (d/k31)/ (d$_{STD}$/k31$_{STD}$) |
|---|---|---|---|---|---|---|
| 1.0 | None | 0 | 7.32 | 23.5 | 186 | 1.00 |
| 3.0 | Applied | 0.10 | 7.54 | 34.3 | 279 | 1.03 |
| 2.0 | | 0.20 | 7.80 | 36.8 | 321 | 1.11 |
| 1.0 | | 0.30 | 7.84 | 40.1 | 357 | 1.13 |
| 0.8 | | 0.31 | 7.86 | 39.6 | 354 | 1.13 |

The diffusion amount of Ag was analyzed by means of EPMA for the samples with the Ag-paste printed thereon. Consequently, as can be seen from Table 9, the thinner was the compacted body thickness, the larger was the diffusion amount of Ag, and when the thickness of the compacted body was 1 mm or less, the diffusion amount of Ag$_2$O was saturated at the value of approximately 0.3% by weight. Because the raw materials for the piezoelectric ceramic composition did not contain Ag, the Ag concerned was found to be ascribable to the diffusion from the Ag-paste in the sintering step.

As shown in Table 9, the improvement of the piezoelectric properties at the high voltage was also verified for the method in which the Ag-paste was diffused as well as for the method in which Ag$_2$O was added.

EXAMPLE 10

In Example 10, laminated piezoelectric elements were fabricated and the piezoelectric properties thereof were compared with those of the bulk materials.

Sample No. 1

A powder for a piezoelectric ceramic composition was prepared by carrying out the mixing of the raw material powders, the calcination and the milling in the same manner as in Example 1 except that Ag$_2$O was not added. The powder thus obtained was added with a vehicle and the mixture thus obtained was kneaded to prepare a piezoelectric layer paste. In parallel, a Ag powder as a conductive material was kneaded with a vehicle to prepare an internal electrode layer paste. Successively, by using the piezoelectric layer paste and the internal electrode layer paste, a green chip to be a precursor for a laminate was fabricated by means of a printing method. The lamination number of the piezoelectric layer paste was set at 20. The green chip was subjected to a binder removal treatment, and then sintered in air at 960° C. for 2 hours to fabricate a laminate. The size of the laminate was 50 mm in length, 10 mm in width and 2 mm in thickness. Terminal electrodes for driving were formed on the prepared laminate, and then lead wires were connected to the terminal electrodes. Then, the laminate was subjected to the polarization treatment under the same conditions as in Example 1 to fabricate a laminated piezoelectric element as Sample No. 1. The piezoelectric layers of Sample No. 1 thus fabricated were analyzed by means of EPMA, and the results thus obtained revealed that the Ag as the metal used in the internal electrodes was detected as Ag$_2$O. The Ag$_2$O uniformly diffused into the piezoelectric layers, and the diffusion amount thereof is as shown in Table 10. Because Ag was not contained in the piezoelectric layer paste, the Ag$_2$O was found to be ascribable to the diffusion of the Ag contained in the internal electrodes into the piezoelectric layers in the sintering step.

Sample No. 2

A laminated piezoelectric element was fabricated under the same conditions as for Sample No. 1 except that a powder, for a piezoelectric ceramic composition, added with Ag$_2$O in a content of 0.10% by weight was used. The piezoelectric layers of Sample No. 2 thus fabricated were analyzed by means of EPMA, and consequently the content of Ag$_2$O in the piezoelectric layers was found to be 0.40% by weight.

Sample No. 3

A piezoelectric ceramic composition sample as a bulk material was prepared in the same manner as in Example 1 except that Ag$_2$O was not added.

Sample No. 4

A piezoelectric ceramic composition sample as a bulk material was prepared by adding Ag$_2$O in a content of 0.10% by weight in the same manner as in Example 1.

Sample No. 5

A piezoelectric ceramic composition sample as a bulk material was prepared by adding Ag$_2$O in a content of 0.30% by weight in the same manner as in Example 1. It is to be noted that the sizes of Sample Nos. 3 to 5 were the same as those of the above-mentioned laminated piezoelectric element samples.

For each of Sample Nos. 1 to 5 thus obtained, the displacement magnitude d at the high voltage was obtained in the same manner as in Example 1. The results thus obtained are shown in Table 10.

TABLE 10

| Sample No. | Addition amount of Ag$_2$O (wt %) | Sintering temperature (° C.) | d (pm/V) | Remarks |
|---|---|---|---|---|
| 1 | 0.30 | 960 | 362 | Laminated piezoelectric element |
| 2 | 0.40 | | 354 | |
| 3 | 0 | | 186 | Bulk material |
| 4 | 0.10 | | 275 | |
| 5 | 0.30 | | 358 | |

Sample No. 1 and Sample No. 3 were both prepared by using a powder for a piezoelectric ceramic composition in which Ag$_2$O was not added. However, in Sample No. 1, as a laminated element, a predetermined amount of Ag$_2$O was contained in the piezoelectric layers owing to the diffusion of Ag$_2$O from the internal electrodes; consequently, Sample No. 1 notably exhibited a displacement magnitude approximately twice as large as that of Sample No. 3 as a bulk material.

Additionally, Sample No. 2 and Sample No. 4 were both prepared by using a powder for a piezoelectric ceramic composition in which Ag$_2$O was added in a content of 0.1% by weight. However, in Sample No. 2 as a laminated element, the content of Ag$_2$O in the piezoelectric layers was increased as a result of the diffusion of Ag$_2$O from the internal electrodes, as compared to Sample No. 4 as a bulk material; accordingly, Sample No. 2 as a laminated element exhibited a larger displacement magnitude d than that of Sample No. 4 as a bulk material.

A comparison between Sample No. 1 in which Ag$_2$O was contained through diffusion and Sample No. 5 in which Ag$_2$O was contained in the piezoelectric layers by means of addition revealed that the displacement magnitudes d of both Samples were equivalent, and both Samples attained high piezoelectric properties. Consequently, it can be said that the content of Ag$_2$O in the piezoelectric layers is essential irrespective of the methods for containing Ag$_2$O.

As can be seen from the above described results, even when a laminate was fabricated by using a piezoelectric layer paste without containing Ag, the Ag contained in the internal electrodes diffused into the piezoelectric layers in the step of sintering the laminate, and the obtained effect was the same as that in the case where the piezoelectric layers were formed by using a Ag-containing piezoelectric layer paste.

To be compared with above Sample Nos. 1 to 5 in which Ta was contained as an additive, the cases where Ta was not contained were also studied. The results thus obtained are shown in Table 11, in which Sample Nos. 6 to 10 correspond to above-mentioned Sample Nos. 1 to 5, respectively.

TABLE 11

| Sample No. | Addition amount of $Ag_2O$ (wt %) | Sintering temperature (° C.) | d (pm/V) | Remarks |
|---|---|---|---|---|
| 6 | 0.30 | 960 | 337 | Laminated piezoelectric element (without containing Ta) |
| 7 | 0.40 | | 329 | |
| 8 | 0 | | 173 | Bulk material (without containing Ta) |
| 9 | 0.10 | | 256 | |
| 10 | 0.30 | | 333 | |

As shown in Table 11, the same effects as described above were also able to be verified for the cases where Ta was not contained.

What is claimed is:

1. A laminated piezoelectric element comprising:
 a plurality of piezoelectric layers each comprising a composite oxide as a main constituent thereof; and
 a plurality of internal electrode layers formed between the piezoelectric layers and comprising Ag; wherein:
 the piezoelectric layers are each comprised of a sintered body comprising:
 the composite oxide, as a main constituent thereof, represented by $(Pb_{a-b}M_b)[(Zn_{1/3}Nb_{2/3})_xTi_yZr_z]O_3$ with the proviso that $0.96 \leq a \leq 1.03$, $0 \leq b \leq 0.1$, $0.05 \leq x \leq 0.15$, $0.25 \leq y \leq 0.5$, $0.35 \leq z \leq 0.6$, $x+y+z=1$, and M represents at least one selected from Sr, Ca and Ba;
 Ag in a content of 1.0% by weight or less, not inclusive of 0, in terms of $Ag_2O$ in relation to the main constituent; and
 Ta in a content of 0.7% by weight or less, not inclusive of 0, in terms of $Ta_2O_5$ in relation to the main constituent.

2. The laminated piezoelectric element according to claim 1, wherein the piezoelectric layers are each comprised of the sintered body comprising Ag in a content of 0.05 to 0.8% by weight in terms of $Ag_2O$.

3. The laminated piezoelectric element according to claim 1, wherein the piezoelectric layers are each comprised of the sintered body comprising Ag in a content of 0.2 to 0.5% by weight in terms of $Ag_2O$.

4. The laminated piezoelectric element according to claim 1, wherein the piezoelectric layers are each comprised of the sintered body comprising at least one selected from Sb, Nb and W in a content of 1.0% by weight or less, not inclusive of 0, in terms of oxide.

5. The laminated piezoelectric element according to claim 1, wherein the internal electrode layers are constituted of a Ag—Pd alloy and the content of Pd in the Ag—Pd alloy is 20% by mass or less.

6. The laminated piezoelectric element according to claim 1, wherein $0.97 \leq a \leq 1.02$.

7. The laminated piezoelectric element according to claim 1, wherein $0 \leq b \leq 0.06$.

8. The laminated piezoelectric element according to claim 1, wherein $0.06 \leq x \leq 0.125$.

9. The laminated piezoelectric element according to claim 1, wherein $0.275 \leq y \leq 0.48$.

10. The laminated piezoelectric element according to claim 1, wherein $0.375 \leq z \leq 0.55$.

11. The laminated piezoelectric element according to claim 1, wherein the M represents Sr.

* * * * *